United States Patent
Chen et al.

(10) Patent No.: US 10,490,543 B2
(45) Date of Patent: Nov. 26, 2019

(54) PLACEMENT METHODOLOGY TO REMOVE FILLER

(71) Applicant: QUALCOMM Incorporated, San Diego, CA (US)

(72) Inventors: Xiangdong Chen, San Diego, CA (US); Sorin Adrian Dobre, San Diego, CA (US); Hyeokjin Lim, San Diego, CA (US); Venugopal Boynapalli, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/831,991

(22) Filed: Dec. 5, 2017

(65) Prior Publication Data

US 2019/0172823 A1 Jun. 6, 2019

(51) Int. Cl.
*H01L 27/02* (2006.01)
*H01L 21/8238* (2006.01)
*G06F 17/50* (2006.01)
*H01L 27/092* (2006.01)

(52) U.S. Cl.
CPC ...... *H01L 27/0207* (2013.01); *G06F 17/5081* (2013.01); *H01L 21/823821* (2013.01); *H01L 21/823871* (2013.01); *H01L 27/0924* (2013.01)

(58) Field of Classification Search
CPC ............. H01L 27/0207; H01L 27/0924; H01L 21/823821; H01L 21/823871
See application file for complete search history.

(56) References Cited

U.S. PATENT DOCUMENTS

| | | | |
|---|---|---|---|
| 4,701,778 A * | 10/1987 | Aneha | H01L 27/0207 257/206 |
| 5,920,486 A | 7/1999 | Beahm et al. | |
| 6,815,982 B2 | 11/2004 | Buhr | |
| 8,847,284 B2 | 9/2014 | Yang et al. | |
| 9,190,405 B2 | 11/2015 | Chen et al. | |
| 9,431,398 B2 | 8/2016 | Kuenemund et al. | |
| 9,514,260 B2 | 12/2016 | Kim et al. | |
| 9,634,026 B1 | 4/2017 | Sahu et al. | |
| 2001/0049815 A1 | 12/2001 | Shinomiya et al. | |
| 2003/0159121 A1 | 8/2003 | Tseng | |
| 2008/0105929 A1 * | 5/2008 | Eimitsu | H01L 27/11807 257/390 |

OTHER PUBLICATIONS

International Search Report and Written Opinion—PCT/US2018/059530—ISA/EPO—dated Apr. 9, 2019.

* cited by examiner

*Primary Examiner* — Jay C Chang
*Assistant Examiner* — Mikka Liu
(74) *Attorney, Agent, or Firm* — Loza & Loza, LLP/Qualcomm

(57) ABSTRACT

In certain aspects, a semiconductor die includes a first cell and a second cell. The first cell includes first transistors, and a first interconnect structure interconnecting the first transistors to form a first circuit. The second cell includes second transistors, and a second interconnect structure interconnecting the second transistors to form a second circuit. The first circuit and the second circuit are configured to perform a same function, and a length of the first cell in a first lateral direction is greater than a length of the second cell in the first lateral direction.

13 Claims, 11 Drawing Sheets

PLACEMENT METHODOLOGY TO REMOVE FILLER

BACKGROUND

Field

Aspects of the present disclosure relate generally to cells on a die, and more particularly, to cells for removing fillers on a die.

Background

A semiconductor die typically includes many cells. Each cell is made up of multiple transistors that are interconnected to form a circuit (e.g., a logic gate). The cells may come from a cell library that defines various cells that can be placed on a die for a semiconductor process. For each cell in the cell library, the cell library may define the layout of transistors in the cell and an interconnect structure for interconnecting the transistors in the cell.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a semiconductor die. The semiconductor die includes a first cell and a second cell. The first cell includes first transistors, and a first interconnect structure interconnecting the first transistors to form a first circuit. The second cell includes second transistors, and a second interconnect structure interconnecting the second transistors to form a second circuit. The first circuit and the second circuit are configured to perform a same function, and a length of the first cell in a first lateral direction is greater than a length of the second cell in the first lateral direction.

A second aspect relates to a method for chip design. The method includes determining whether there is a gap between a first cell and a second cell on a cell layout for a die. The method also includes replacing the first cell with a third cell if a determination is made that there is a gap between the first cell and the second cell, wherein the first cell and the third cell are configured to perform a same function, and a length of the third cell in a first lateral direction is greater than a length of the first cell in the first lateral direction.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A semiconductor die (chip) typically includes many cells. Each cell is made up of multiple transistors that are interconnected to form a circuit (e.g., a logic gate). The cells may come from a cell library that defines various cells that can be placed on the die for a semiconductor process. For each cell in the cell library, the cell library may define the layout of the transistors in the cell and an interconnect structure for interconnecting the transistors in the cell. Multiple cells on a die may be interconnected by upper metal interconnects to form more complex circuits.

Figure 1:
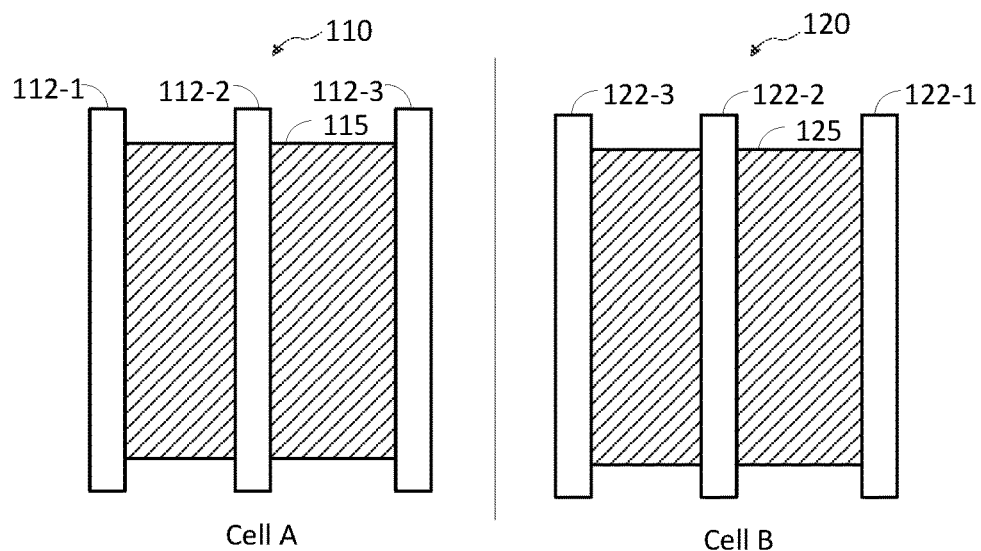
FIG. 1 shows an example of two cells that are next to each other according to certain aspects of the present disclosure.

FIG. 1 shows an example of a first cell 110 (labeled "cell A") and a second cell 120 (labeled "cell B") on a die (chip). In the discussion below, the first cell 110 is referred to as cell A and the second cell 120 is referred to as cell B.

Cell A 110 includes multiple gates 112-1 to 112-3 that are spaced apart by a gate pitch, and cell B 120 includes multiple gates 122-1 to 122-3 that are spaced apart by the gate pitch. Each cell 110 and 120 also includes one or more active regions 115 and 125, in which each active region includes doped regions and/or fins. The doped regions and/or fins of the active regions 115 and 125 form the sources, drains and channels of the transistors in the cells 110 and 120, as discussed further below. Each cell 110 and 120 also includes local metal interconnects (not show in FIG. 1) that interconnect the transistors in the cell to form a circuit (e.g., logic gate).

In the example shown in FIG. 1, cell A 110 and cell B 120 are next to each other. However, in some cases, it may not be possible to place cell A 110 and cell B 120 next to each other (e.g., due to layout and routing restrictions). As a result, there may be a gap between cell A 110 and cell B 120, an example of which is shown in FIG. 2.

Figure 2:
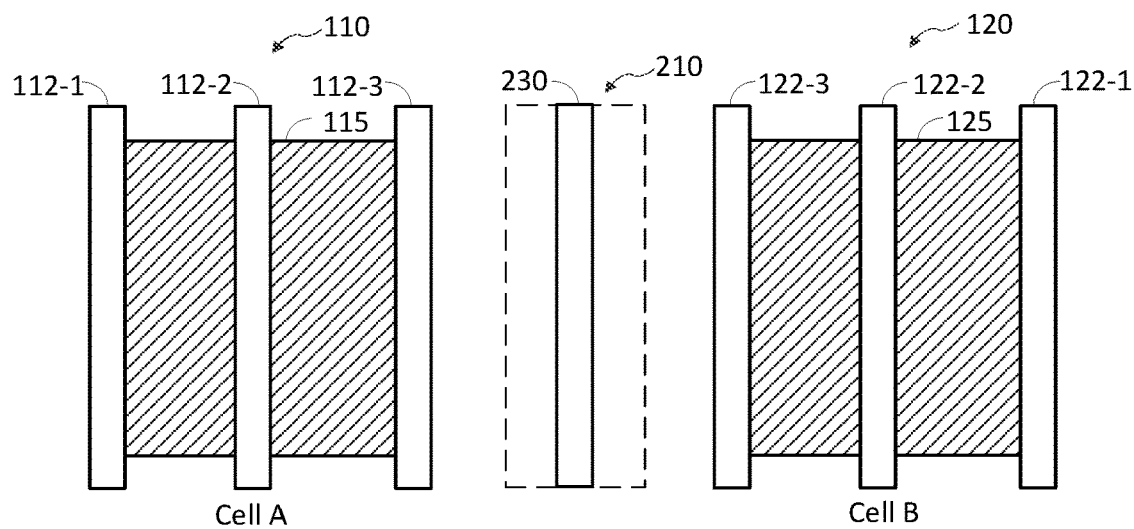
FIG. 2 shows an example in which the two cells are spaced apart by a gap that is filled in by a filler cell according to certain aspects of the present disclosure.

In the example shown in FIG. 2, a filler cell 210 is placed in the gap between cell A 110 and cell B 210 to fill in the gap. The filler cell 210 is a non-functional cell that includes a gate 230 with an empty active region. The filler cell 210 may be used to maintain continuity (e.g., gate pattern) on the chip.

A drawback of using a filler cell 210 to fill in the gap is that the filler cell 210 may alter the electrical characteristics of one or more adjacent cells (i.e., cells 110 and 120), which can result in timing issues. Accordingly, a better approach is needed.

Implementations of the present disclosure fill in a gap between two cells by replacing one of the two cells with a larger version of the cell instead of inserting a filler cell between the two cells, as discussed further below.

Figure 3:
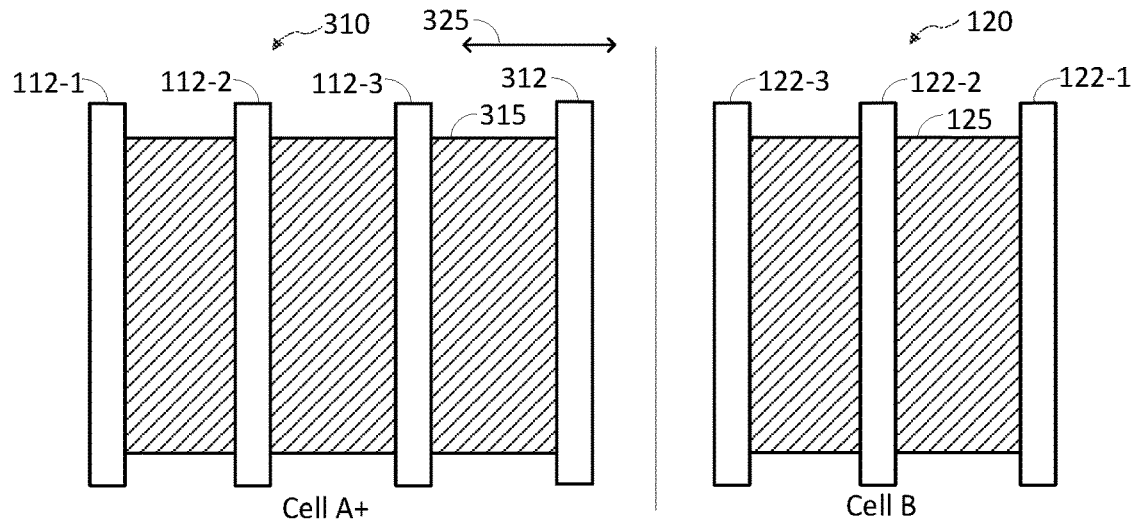
FIG. 3 shows an example in which one of the two cells in FIG. 2 is replaced by a larger version of the cell to remove the filler cell according to certain aspects of the present disclosure.

FIG. 3 shows an example in which cell A 110 shown in FIG. 2 is replaced by a larger version of cell A (labeled "cell A+") to fill in the gap. In the discussion below, the larger version of cell A is referred to as cell A+ 310.

In this example, cell A+ 310 is larger than cell A 110 by at least one gate pitch in lateral direction 325 in order to fill in the gap. As used herein, the term "lateral" refers to a direction that runs approximately parallel to the substrate of the die. Cell A+ 310 is made larger than cell A 110 by including an additional gate 312, in which the additional gate 312 is a dummy gate (i.e., a non-functional gate). In the example shown in FIG. 3, the additional gate 312 is spaced apart from gate 112-3 by approximately one gate pitch.

In addition, the active region 315 of cell A+ 310 extends approximately one gate pitch farther in lateral direction 325 compared with the active region 115 of cell A. In the example shown in FIG. 3, the active region 315 extends to the additional gate 312.

Cell A+ 310 is functionally equivalent to cell A 110 (e.g., performs the same logic function). For example, if cell A 110 implements a NAND gate, then cell A+ 310 also implements a NAND gate.

Further, the relative positions of the input and output metal lines (not shown in FIG. 3) of cell A+ 310 may be approximately the same as the relative positions of the input and output metal lines of cell A 110. As a result, the layout of the upper metal interconnects immediately above the cells does not need to be changed when cell A 110 is replaced by cell A+ 310 to fill in the gap. This reduces the impact on the layout of the upper metal interconnects of the die.

The cell placement methodology according to certain aspects of the present disclosure may be summarized as follows:

1. Place cells on the die (chip); and
2. When there is a gap between two cells, replace one of the cells with a larger version of the cell to fill in the gap, in which the larger version of the cell is functionally equivalent.

The cell placement methodology helps avoid the need of inserting a filler cell to fill in the gap, and therefore avoids the drawbacks associated with using a filler cell discussed herein.

Exemplary implementations of the cells 110, 120 and 310 will now be described according to certain aspects of the present disclosure.

Figure 4A:
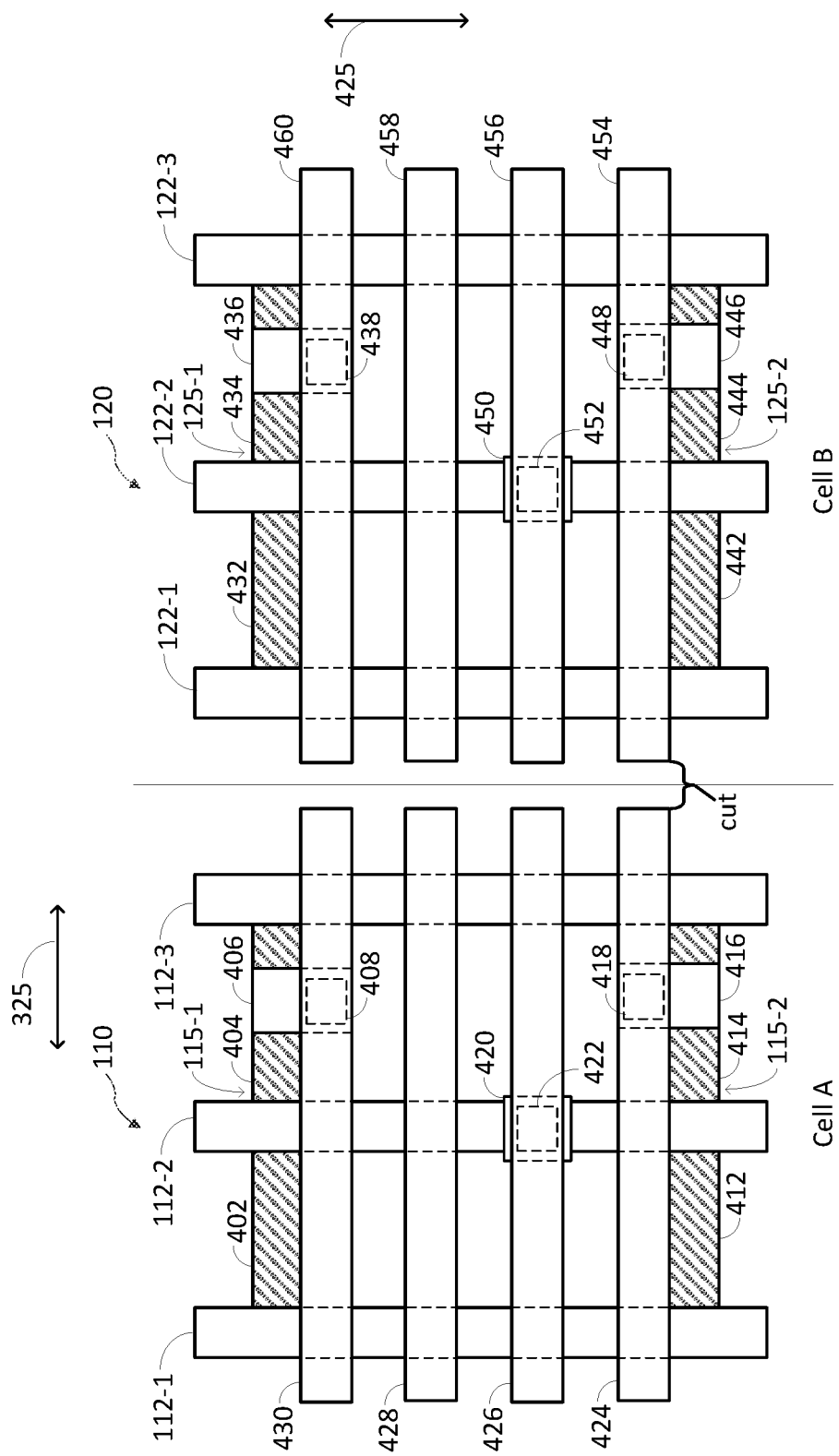
FIG. 4A shows an exemplary implementation of the cells shown in FIG. 1 according to certain aspects of the present disclosure.

FIG. 4A shows a top view of an exemplary implementation of cell A 110 according to certain aspects of the present disclosure. In this example, cell A 110 includes an N-type field effect transistor (NFET) and a P-type field effect transistor (PFET) that are interconnected to form an inverter. As discussed further below, the gates of the NFET and the PFET are coupled together at the input of the inverter, and the drains of the NFET and the PFET are coupled together at the output of the inverter.

In the example shown in FIG. 4A, cell A 110 includes a first active region 115-1 bounded by gates 112-1 and 112-3 in lateral direction 325. In this example, the first active region 115-1 is used to form the PFET of cell A 110. The first active region 115-1 may include one or more P-type doped regions and/or one or more fins. The portion of the first active region 115-1 underneath gate 112-2 forms the channel of the PFET, the portion of the first active region 115-1 to the right of gate 112-2 forms the drain 404 of the PFET, and the portion of the first active region 115-1 to the left of gate 112-2 forms the source 402 of the PFET. Cell A 110 may also include a thin insulating layer (e.g., dielectric) between gate 112-2 and the portion of the first active region 115-1 underneath gate 112-2.

Cell A 110 also includes a second active region 115-2 bounded by gates 112-1 and 112-3 in lateral direction 325. In this example, the second active region 115-2 is used to form the NFET of cell A 110. The second active region 115-2 may include one or more N-type doped regions and/or one or more fins. The portion of the second active region 115-2 underneath gate 112-2 forms the channel of the NFET, the portion of the second active region 115-2 to the right of gate 112-2 forms the drain 414 of the NFET, and the portion of the second active region 115-2 to the left of gate 112-2 forms the source 412 of the NFET. Cell A 110 may also include a thin insulating layer (e.g., dielectric) between gate 112-2 and the portion of the second active region 115-2 underneath gate 112-2.

In the example shown in FIG. 4A, gate 112-2 is common to the PFET and NFET of cell A 110, in which a portion of gate 112-2 within the PFET acts as the gate of the PFET and another portion of gate 112-2 within the NFET acts as the gate of the NFET. Thus, the gates of the PFET and NFET are coupled together in this example. The other gates 112-1 and 112-3 in cell A 110 may be dummy gates.

Cell A 110 also includes a first drain contact 406 formed over the drain 404 of the PFET, and a second drain contact 416 formed over the drain 414 of the NFET. The drain contacts 406 and 416 may be formed from a first contact layer of the die (e.g., using photolithographic and etching processes). The first drain contact 406 provides an electrical contact for the drain of the PFET, and the second drain contact 416 provides an electrical contact for the drain of the NFET.

Cell A 110 also includes a gate contact 420 formed over gate 112-2. The gate contact 420 may be formed from a second contact layer of the die (e.g., using photolithographic and etching processes). The gate contact 420 provides an electrical contact for the gates of the PFET and the NFET since gate 112-2 is common to the PFET and the NFET.

Cell A 110 also includes a first metal line 424, a second metal line 426, a third metal line 428, and a fourth metal line 430. The metal lines 424, 426, 428 and 430 run parallel to one another and extend along lateral direction 325. The metal lines 424, 426, 428 and 430 are above the gates 112-1, 112-2 and 112-3, and may be formed from a first metal interconnect layer of the die (e.g., using photolithographic and etching processes). Note that structures beneath the metal lines 424, 426, 428 and 430 are shown with dashed lines. Also, the first active region 115-1 may extend underneath the fourth metal line 430 in lateral direction 425, and the second active region 115-2 may extend underneath the first metal line 424 in lateral direction 425.

Cell A 110 also includes a via 408 that electrically couples the first drain contact 406 to the fourth metal line 430, a via 422 that electrically couples the gate contact 420 to the second metal line 426, and a via 418 that electrically couples the second drain contact 416 to the first metal line 424. As used herein, the term "via" refers to a vertical interconnect structure used to electrically couple different layers of the die. As discussed further below, the metal lines and vias form part of the local interconnect structure of cell A 110.

Figure 4B:
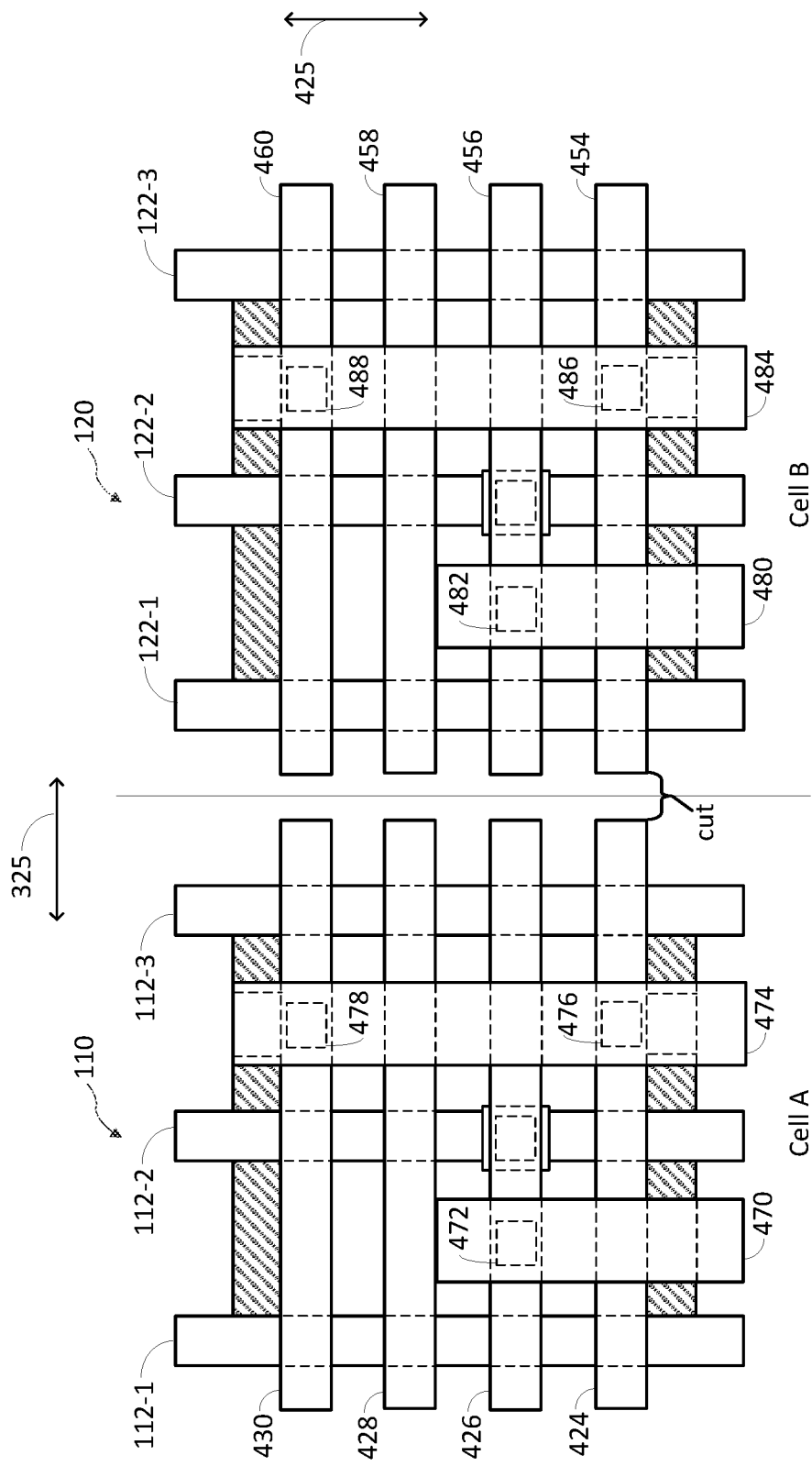
FIG. 4B shows exemplary input metal lines and exemplary output metal lines for the cells shown in FIG. 4A.

FIG. 4B shows a top view of additional layers of cell A 110 that are above the metal lines 424, 426, 428 and 430. As shown in FIG. 4B, cell A 110 also includes an input metal line 470 and an output metal line 474. The input metal line 470 and the output metal line 474 are formed from a second metal interconnect layer of the die (e.g., using photolithographic and etching processes), in which the second metal interconnect layer is above the first metal interconnect layer. As shown in FIG. 4B, the input metal line 470 and the output metal line 474 run parallel to one another and extend along lateral direction 425, which is approximately perpendicular to lateral direction 325. Note that structures underneath the input metal line 470 and the output metal line 474 are shown with dashed lines.

Cell A 110 also includes a via 472 that electrically couples the second metal line 426 to the input metal line 470. Thus, in this example, gate 112-2 (which is common to the PFET and NFET of cell A 110) is coupled to the input metal line 470 through the gate contact 420, the via 422, the second metal line 426, and the via 472. The input metal line 470 provides an electrical contact for electrically coupling upper metal interconnects of the die to the input of the inverter of cell A 110.

Cell A 110 also includes a via 478 that electrically couples the fourth metal line 430 to the output metal line 474, and a via 476 that electrically couples the first metal line 424 to the output metal line 474. Thus, the drain 404 of the PFET is coupled to the output metal line 474 through the first drain contact 406, the via 408, the fourth metal line 430, and the via 478. The drain 414 of the NFET is coupled to the output metal line 474 through the second drain contact 416, the via 418, the first metal line 424, and the via 476. Thus, in this example, the drains 404 and 414 of the NFET and PFET are coupled together at the output metal line 474, which forms the output of the inverter of cell A 110. The output metal line 474 provides an electrical contact for electrically coupling upper metal interconnects of the die to the output of the inverter of cell A 110.

Referring back to FIG. 4A, the source 402 of the PFET may be coupled to a voltage supply rail of the die through an interconnect structure (not shown), and the source 412 of the NFET may be coupled to a ground rail of the die through another interconnect structure (not shown).

In the example shown in FIG. 4A, cell B 120 also implements an inverter and has a similar structure as cell A 110. In this example, cell A 110 and cell B 120 may be different instances of the same cell design from a cell library. Cell B 120 includes an NFET and a PFET that are interconnected to form an inverter in a similar manner as cell A 110.

In the example shown in FIG. 4A, cell B 120 includes a first active region 125-1 bounded by gates 122-1 and 122-3, in which the portion of the first active region 125-1 underneath gate 122-2 forms the channel of the PFET, the portion of the first active region 125-1 to the right of gate 122-2 forms the drain 434 of the PFET, and the portion of the first active region 125-1 to the left of gate 122-2 forms the source 432 of the PFET. Cell B 120 may also include a thin insulating layer (e.g., dielectric) between gate 122-2 and the portion of the first active region 125-1 underneath gate 122-2.

Cell B 120 also includes a second active region 125-2 bounded by gates 122-1 and 122-3, in which the portion of the second active region 125-2 underneath gate 122-2 forms the channel of the NFET, the portion of the second active region 125-2 to the right of gate 122-2 forms the drain 444 of the NFET, and the portion of the second active region 145-2 to the left of gate 122-2 forms the source 442 of the NFET. Cell B 120 may also include a thin insulating layer (e.g., dielectric) between gate 122-2 and the portion of the second active region 125-2 underneath gate 122-2.

In the example shown in FIG. 4A, gate 122-2 is common to the PFET and NFET of cell B 120, in which a portion of the gate 122-2 within the PFET acts as the gate of the PFET and another portion of the gate 122-2 within the NFET acts as the gate of the NFET. Thus, the gates of the PFET and NFET are coupled together in this example. The other gates 122-1 and 122-3 in cell B 120 may be dummy gates.

Cell B 120 also includes a first drain contact 436 formed over the drain 434 of the PFET, a second drain contact 446 formed over the drain 444 of the NFET, and a gate contact 450 formed over gate 122-2 (which is common to the PFET and the NFET).

Cell B 120 also includes a first metal line 454, a second metal line 456, a third metal line 458, and a fourth metal line 460, in which the metal lines run parallel to one another and extend along lateral direction 325. The metal lines 454, 465, 458 and 460 of the cell B 120 are formed from the first metal interconnect layer (i.e., the same metal interconnect layer used to form the metal lines 424, 426, 428 and 430 of cell A 110).

Cell B 120 also includes a via 438 that electrically couples the first drain contact 436 to the fourth metal line 460, a via 452 that electrically couples the gate contact 450 to the second metal line 456, and a via 448 that electrically couples the second drain contact 446 to the first metal line 454.

FIG. 4B shows a top view of additional layers of cell B 120 that are above the metal lines 454, 456, 458 and 460. As shown in FIG. 4B, cell B 120 also includes an input metal line 480 and an output metal line 484. The input metal line 480 and the output metal line 484 are formed from the second metal interconnect layer (i.e., the same metal interconnect layer used to form the input metal line 470 and the output metal line 474 of cell A 110).

Cell B 120 also includes a via 482 that electrically couples the second metal line 456 to the input metal line 480. Thus, in this example, gate 122-2 (which is common to the PFET and NFET of cell B 120) is coupled to the input metal line 480 through the gate contact 450, the via 452, the second metal line 456, and the via 482. The input metal line 470 provides an electrical contact for electrically coupling upper metal interconnects of the die to the input of the inverter of cell B 120.

Cell B 120 also includes a via 488 that electrically couples the fourth metal line 460 to the output metal line 484, and a via 486 that electrically couples the first metal line 454 to the output metal line 484. Thus, the drain 434 of the PFET is coupled to the output metal line 484 through the first drain contact 436, the via 438, the fourth metal line 460, and the via 488. The drain 444 of the NFET is coupled to the output metal line 484 through the second drain contact 446, the via 448, the first metal line 454, and the via 486. Thus, in this example, the drains 434 and 444 of the NFET and PFET are coupled together at the output metal line 484, which forms the output of cell B 120.

Referring back to FIG. 4A, the source 432 of the PFET may be coupled to a voltage supply rail of the die through an interconnect structure (not shown), and the source 442 of the NFET may be coupled to a ground rail of the die through another interconnect structure (not shown).

Thus, in the example shown in FIGS. 4A and 4B, each of cells A and B implements an inverter. Cell A 110 and cell B 110 may come from the same cell design in a cell library. In this example, cell A 110 and cell B 120 are located next to each other on the die.

During processing, long metal lines formed from the first metal interconnect layer of the die are cut along the boundaries of the cell A and cell B to form the metal lines 424, 426, 428 and 430 of cell A 110 and the metal lines 454, 456, 458 and 460 of cell B 120 discussed above. For example, a first long metal line is cut between cell A 110 and cell B 120 to form the first metal line 424 of cell A and the first metal line 454 of cell B. The long metal lines extend along lateral direction 325, and are cut along a cut line in lateral direction 425 (e.g., using photolithographic and etching processes). In FIG. 4A, the location of the cut line between cell A 110 and cell B 120 is labeled "cut."

Figure 5A:
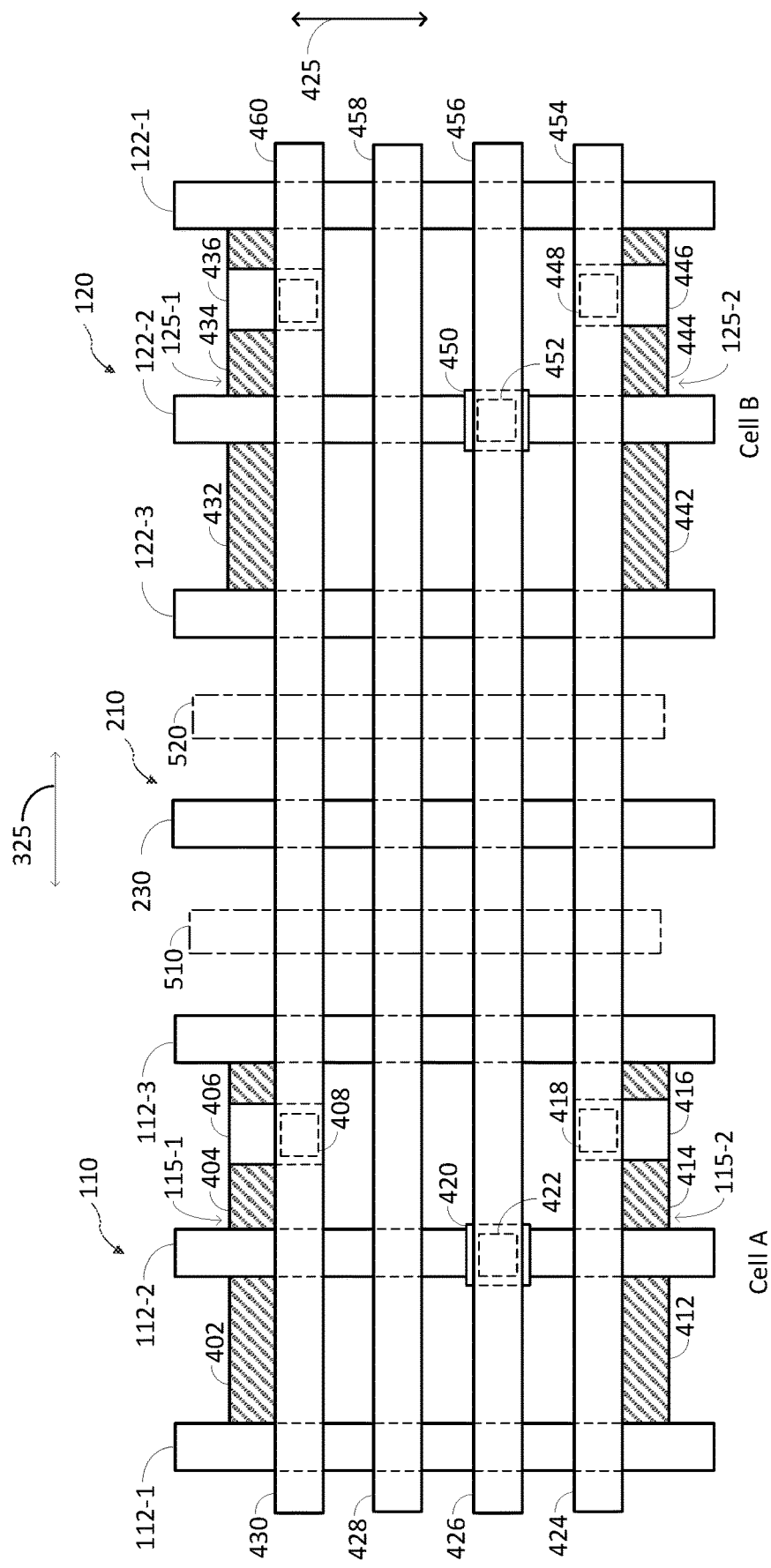
FIG. 5A shows an exemplary implementation of the cells shown in FIG. 2 according to certain aspects of the present disclosure.
Figure 5B:
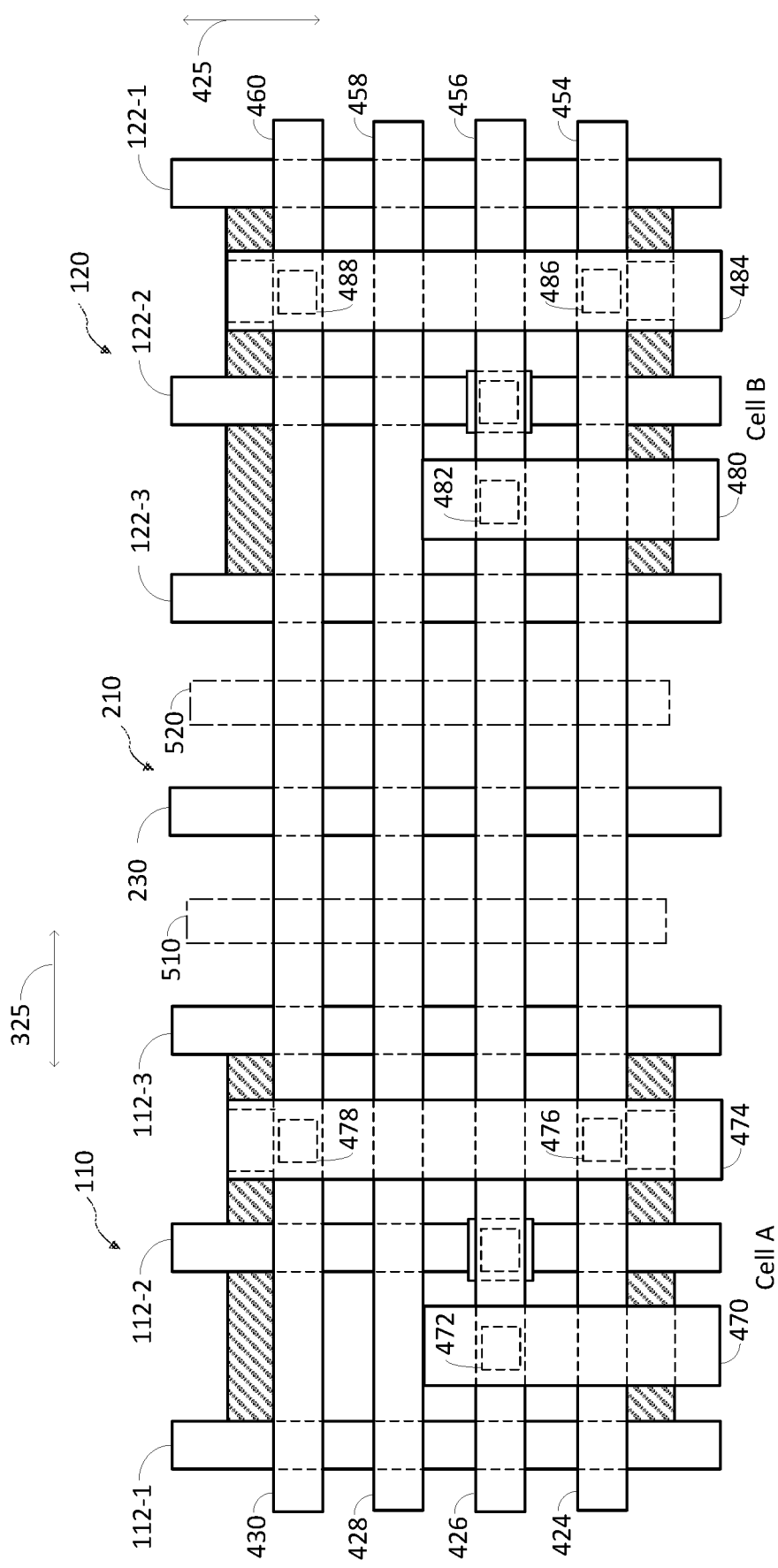
FIG. 5B shows exemplary input metal lines and exemplary output metal lines for the cells shown in FIG. 5A.

FIG. 5A shows an example in which cell A 110 and cell B 120 are spaced apart by a gap (e.g., due to layout and routing restrictions that prevent placing cell A 110 and cell B 120 next to each other). As shown in FIG. 5A, the filler cell 210 is placed between cell A 110 and cell B 210 to fill in the gap. The filler cell 210 includes non-functional (dummy) gate 230. FIG. 5B shows additional layers of cell A 110 and cell B 120, as discussed above with reference to FIG. 4B.

FIG. 5A shows the long metal lines used to form the metal lines 424, 426, 428 and 430 of cell A 110 and the metal lines 454, 456, 458 and 460 of cell B before the long metal lines are cut during processing. In this regard, FIG. 5A shows two possible cut lines 510 and 520 for the long metal lines. Each of the cut lines 510 and 520 extends along lateral direction 425, which is approximately perpendicular to the orientation of the long metal lines. Cut line 510 is located to the left of the filler cell 210, and cut line 520 is located to the right of the filler cell 210.

During processing, the long metal lines may be cut along cut line 510, cut along cut line 520, or cut along both cut lines 510 and 520. If the long metal lines are cut along cut line 520 but not along cut line 510, then the metal lines 424, 426, 428 and 430 extend across the filler cell 230. This changes the electrical characteristics of cell A 110 compared to the case where the long metal lines are cut along cut line 510. If, on the other hand, the long metal lines are cut along cut line 510 but not along cut line 520, then the metal lines 454, 456, 458 and 460 extend across the filler cell 230. This changes the electrical characteristics of cell B 120 compared with the case where the long metal lines are cut along cut line 520.

Thus, the electrical characteristics of the cells depend on which cut lines 510 and 520 are used. However, during the design stage of the die (chip), it may not be known which cut lines will be used during processing. For example, the decision of which cut lines to use may be made after the cells of the die have been laid out. Not knowing which cut lines will be used during the design stage increases the amount of uncertainty in the electrical characteristics of the cells during the design stage. The increased uncertainty in the electrical characteristics of the cells may require increasing timing margins for a circuit incorporating the cells to account for the increased uncertainty, which lowers the performance of the circuit.

Figure 6A:
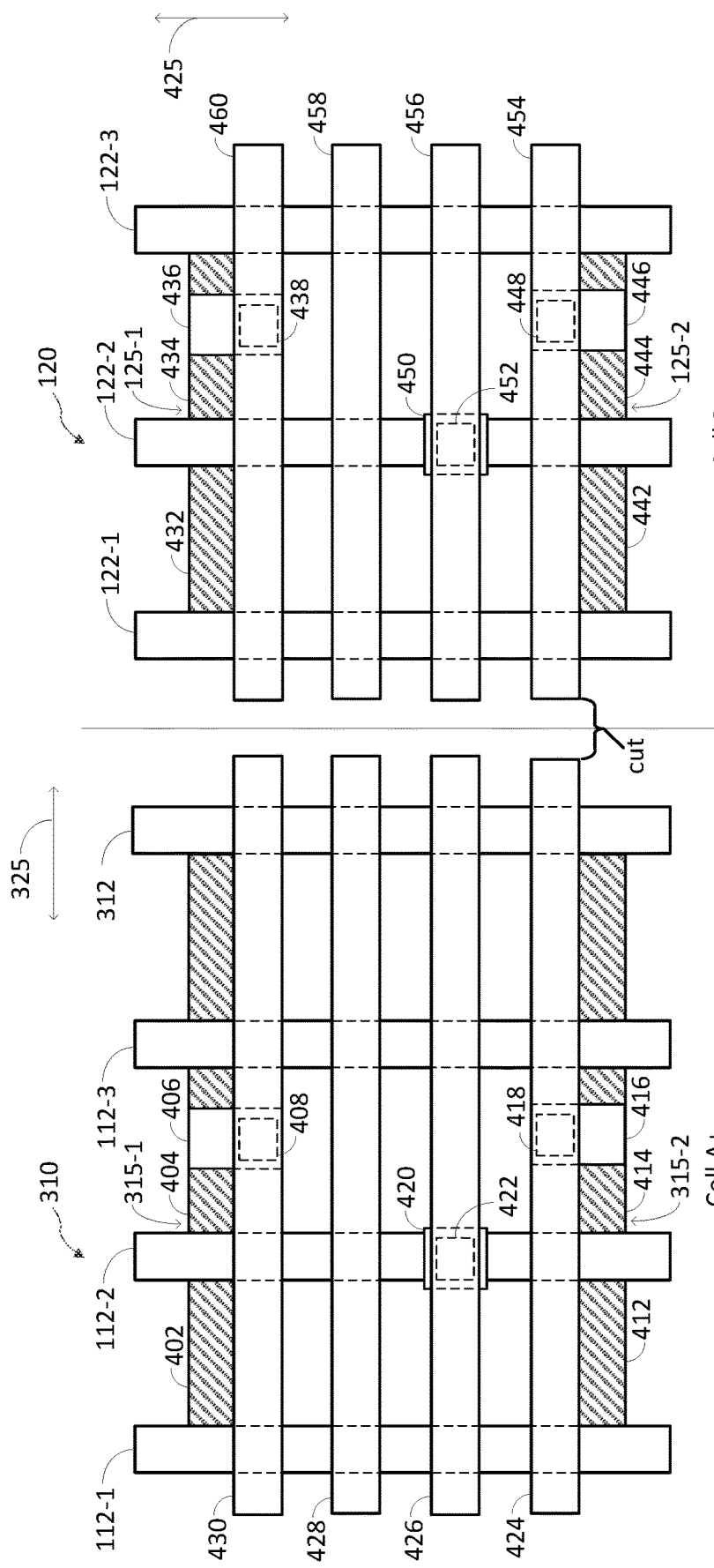
FIG. 6A shows an exemplary implementation of the cells shown in FIG. 3 according to certain aspects of the present disclosure.

FIG. 6A shows an exemplary implementation of cell A+ 310, which is a larger version of cell A 110. Cell A+ 310 fills in the gap shown in FIG. 5A, thereby removing the need for the filler cell 210.

Cell A+ 310 performs the same function as cell A 110. In the example in FIG. 6A, cell A+ 310 implements an inverter, similar to the example of cell A 110 shown in FIG. 5A. In this regard, cell A+ 310 includes the PFET, the NFET, and the interconnect structure of cell A 110. In FIG. 6A, the structures that are common to both cell A+ 310 and cell A 110 are identified by the same reference numbers. For brevity, a detail description of the structures that are common to cell A+ 310 and cell A 110 is not repeated here.

In this example, cell A+ 310 includes the additional gate 312 to the right of gate 112-3. As discussed above, the additional gate 312 is a dummy gate (i.e., a non-functional gate), and is spaced apart from gate 112-3 by approximately one gate pitch, where one gate pitch is the spacing between adjacent gates in cell A 110 and cell A+ 310. The additional gate 312 extends the length of cell A+ 310 in lateral direction 325 by at least one gate pitch compared with the length of cell A 110 in lateral direction 325. The increased length allows cell A+ 310 to fill in the gap without the need for the filler cell 210 shown in FIG. 5A. In the example in FIG. 6A, cell A+ 310 is approximately the same length as cell A 110 in lateral direction 425.

Cell A+ 310 includes a first active region 315-1 which is similar to the first active region 115-1 of cell A 110 except that the first active region 315-1 of cell A+ 310 extends to the additional gate 312. Thus, the first active region 315-1 of cell A+ 310 is longer than the first active region 115-1 of cell A 110 in lateral direction 325 by at least one gate pitch. The first active region 315-1 forms the channel, the drain 404, the source 402 of the PFET, similar to the first active region 115-1 of cell A 110. The first active region 315-1 is bounded by gates 112-1 and 312 in lateral direction 325.

Cell A+ 310 also includes a second active region 315-2 which is similar to the second active region 115-2 of cell A 110 except that the second active region 315-2 of cell A+ 310 extends to the additional gate 312. Thus, the second active region 315-2 of cell A+ 310 is longer than the second active region 115-2 of cell A 110 in lateral direction 325 by at least one gate pitch. The second active region 315-2 forms the channel, the drain 414, the source 412 of the NFET, similar to the second active region 115-2 of cell A 110. The second active region 315-2 is bounded by gates 112-1 and 312 in lateral direction 325.

Figure 6B:
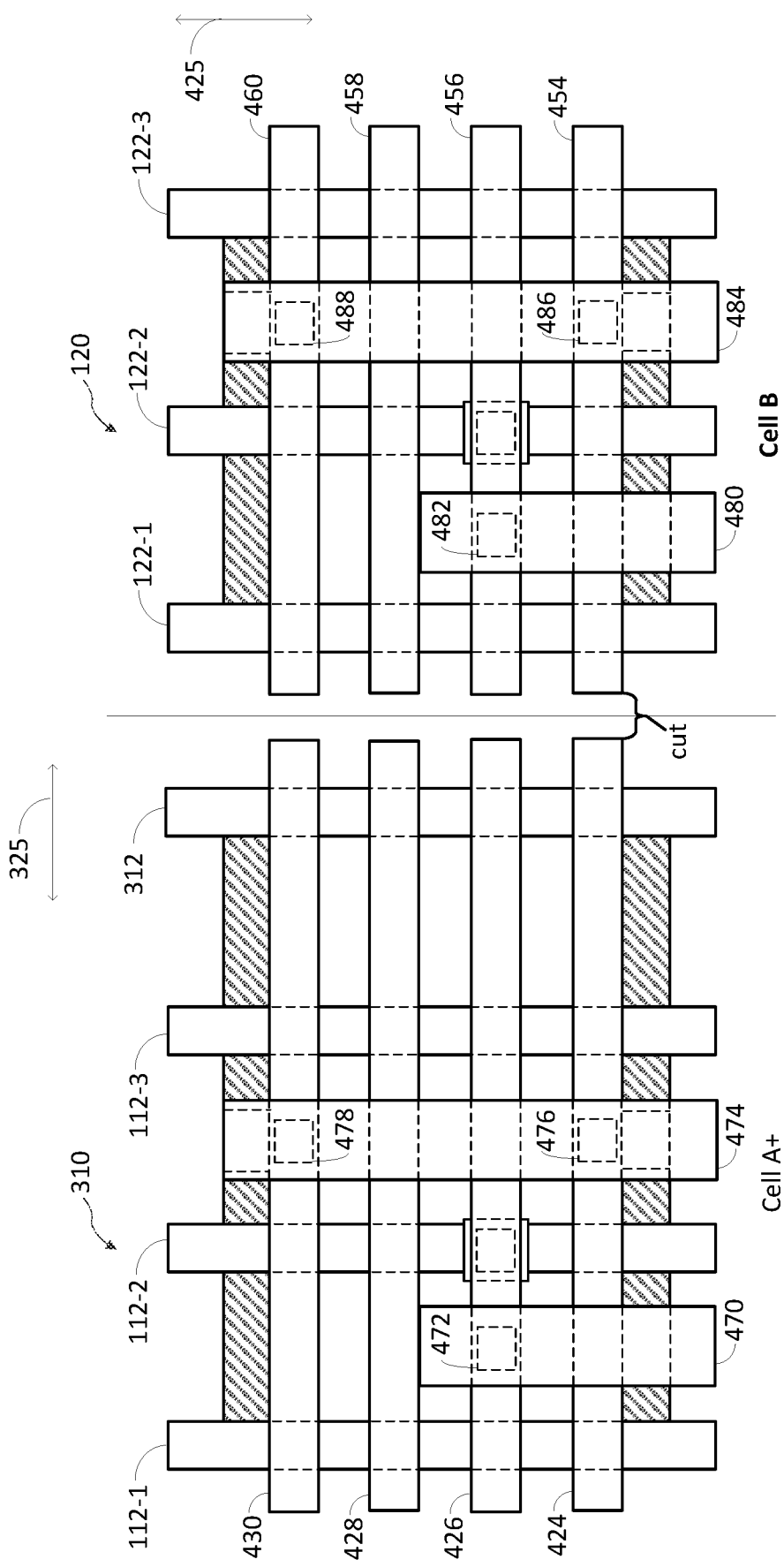
FIG. 6B shows exemplary input metal lines and exemplary output metal lines for the cells shown in FIG. 6A.

FIG. 6B shows the input metal line 470 and the output metal lines 474 of cell A+ 310. As can been seen by comparing FIG. 6B with FIG. 5B, the dimensions and relative positions the input metal line 470 and the output metal line 474 are approximately the same for cell A+ 310 and cell A 110. Thus, the layout of the upper metal interconnects of the die that couple to the input metal line 470 and the output metal line 474 does need to be changed when cell A 110 is replaced by cell A+ 310 to fill in the gap.

The long metal lines used to form the metal lines 424, 426, 428 and 430 of cell A+ 310 and the metal lines 454, 456, 458 and 460 of cell B 120 are cut between cell A+ 310 and cell B 120 along lateral direction 425. In FIG. 6A, the location of the cut line between cell A+ 310 and cell B 120 is labeled "cut." In this example, there is one location for the cut line, which is known at the design stage. This reduces the electrical uncertainty caused by the uncertainty in the location(s) of the cut lines between cell A 110 and cell B 120 discussed above with reference to FIG. 5A.

In the above example, each of cell A 110 and cell A+ 310 implements an inverter. However, it is to be appreciated that the present disclosure is not limited to this example. For instance, each of cell A 110 and cell A+ 310 may implement another type of logic gate including, for example, a NAND gate, a NOR gate, etc. For each of these examples, cell A+ 310 may be realized by adding one or more additional gates (e.g., gate 312) to cell A 110, and extending the active regions of cell A 110 in lateral direction 325 by at least one gate pitch.

In the above example, the length of cell A+ 310 in lateral direction 325 is greater than the length of cell A 110 in lateral direction 325 by at least one gate pitch. For cases where there is a gap between cell A 110 and cell B 120, this allows cell A+ 310 to fill in the gap without the need for a filler cell by replacing cell A 110 with cell A+ 310. The length of cell A+ 310 in lateral direction 425 is approximately the same as the length of cell A 110 in lateral direction 425, which is perpendicular to lateral direction 325. This allows cell A+ 310 to fill in the gap without affecting the placement of other cells (not shown) on the die.

The interconnect structure (e.g., the drain contacts 406 and 416, the gate contact 420, the vias 408, 418 and 422, the metal lines 424, 426 and 430, the vias 472, 476 and 478, the input metal line 470, and the output metal line 474) of each of cell A 110 and cell A+310 interconnects the respective transistors (e.g., respective PFET and NFET) to perform the same function (e.g., implement the same logic gate). Thus, the functionality of cell A 110 is preserved when cell A 110 is replaced by cell A+ 310 to fill in a gap.

Further, the spacing between of the input metal line and output metal line of cell A+ 310 is approximately the same as the spacing between the input metal line and output metal line of cell A 110. As a result, the layout of the upper metal interconnects immediately above the cells does not need to be changed when cell A 110 is replaced by cell A+ 310 to fill in a gap.

Figure 7:
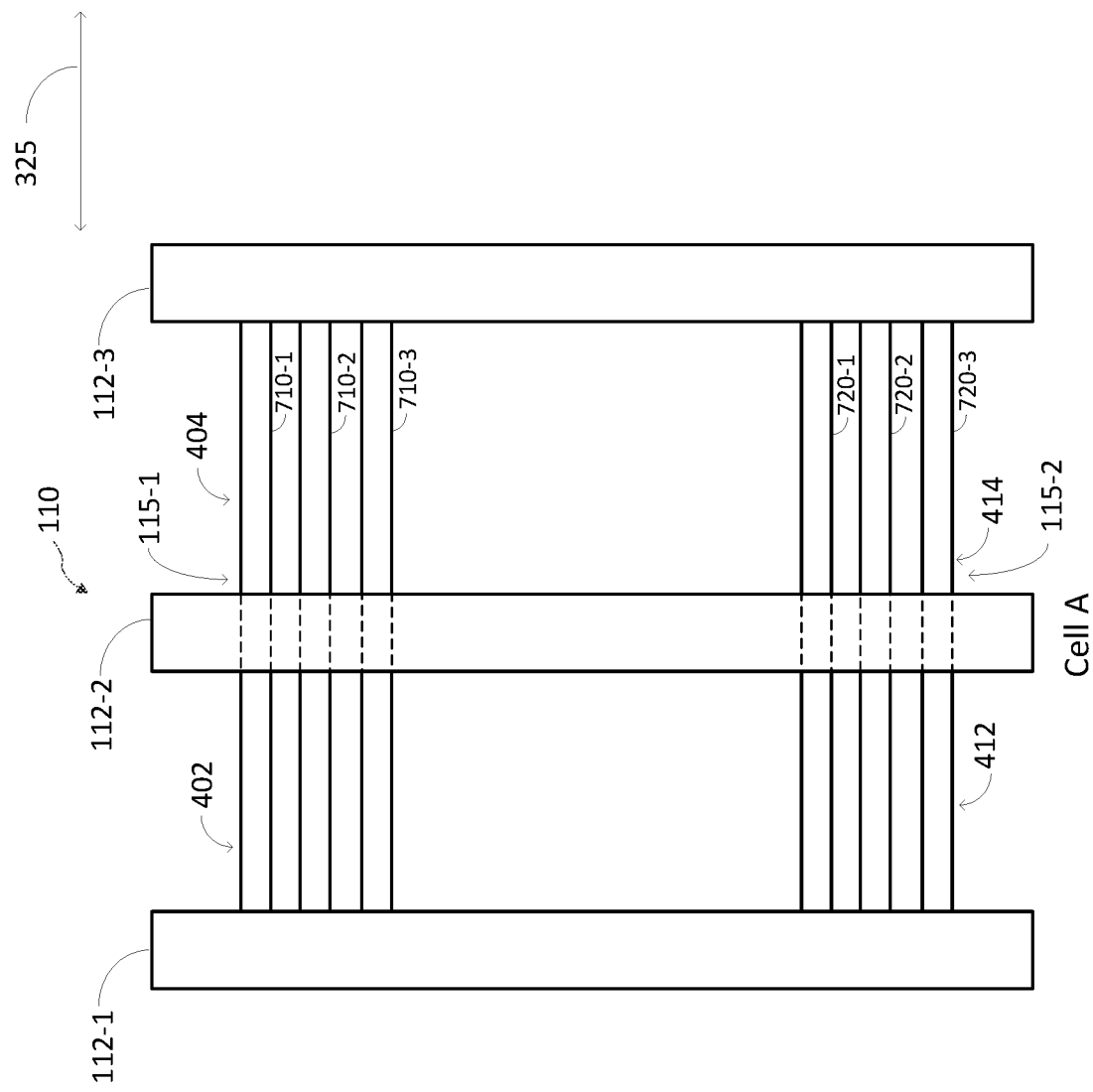
FIG. 7 shows an example of a cell including active regions, in which each active region includes multiple fins according to certain aspects of the present disclosure.

As discussed above, each one of the first and second active regions 115-1 and 115-2 of cell A 110 may include one or more fins. In this regard, FIG. 7 shows an example in which the first active region 115-1 of cell A 110 includes multiple fins 710-1 to 710-3, and the second active region 115-2 of cell A 110 includes multiple fins 720-1 to 720-3. The fins 710-1 to 710-3 and 720-1 to 720-3 may be fabricated using a FinFET semiconductor process. Note that the drain contacts 406 and 416, the vias 408, 428 and 420, and the metal lines 424, 426, 428 and 430 are not shown in FIG. 7 to provide a clearer view of the fins 710-1 to 710-3 and 720-1 to 720-3.

In this example, the fins 710-1 to 710-3 in the first active region 115-1 run parallel with one another, and extend in lateral direction 325. The fins 710-1 to 710-3 are bounded by gates 112-1 and 112-3 and pass through gate 112-2. The portion of the fins 710-1 to 710-3 passing through gate 112-2 forms the channel of the PFET of cell A 110. In this example, cell A 110 may include a thin insulator (e.g., dielectric) between gate 112-2 and the portion of the fins 710-1 to 710-3 passing through gate 112-2. A portion of the fins 710-1 to 710-3 to the right of gate 112-2 forms the drain 404 of the PFET, and a portion of the fins 710-1 to 710-3 to the left of gate 112-2 forms the source 402 of the PFET. The first drain contact 406 shown in FIGS. 4A and 5A may be formed to the right of gate 112-2 over the fins 710-1 to 710-3.

The fins 720-1 to 720-3 in the second active region 115-2 run parallel with one another, and extend in lateral direction 325. The fins 720-1 to 720-3 are bounded by gates 112-1 and 112-3 and pass through gate 112-2. The portion of the fins 720-1 to 720-3 passing through gate 112-2 forms the channel of the NFET of cell A 110. In this example, cell A 110 may include a thin insulator (e.g., dielectric) between gate 112-2 and the portion of the fins 720-1 to 720-3 passing through gate 112-2. A portion of the fins 720-1 to 720-3 to the right of gate 112-2 forms the drain 414 of the NFET, and a portion of the fins 720-1 to 720-3 to the left of gate 112-2 forms the source 412 of the NFET. The second drain contact 416 shown in FIGS. 4A and 5A may be formed to the right of gate 112-2 over the fins 710-1 to 710-3.

Figure 8:
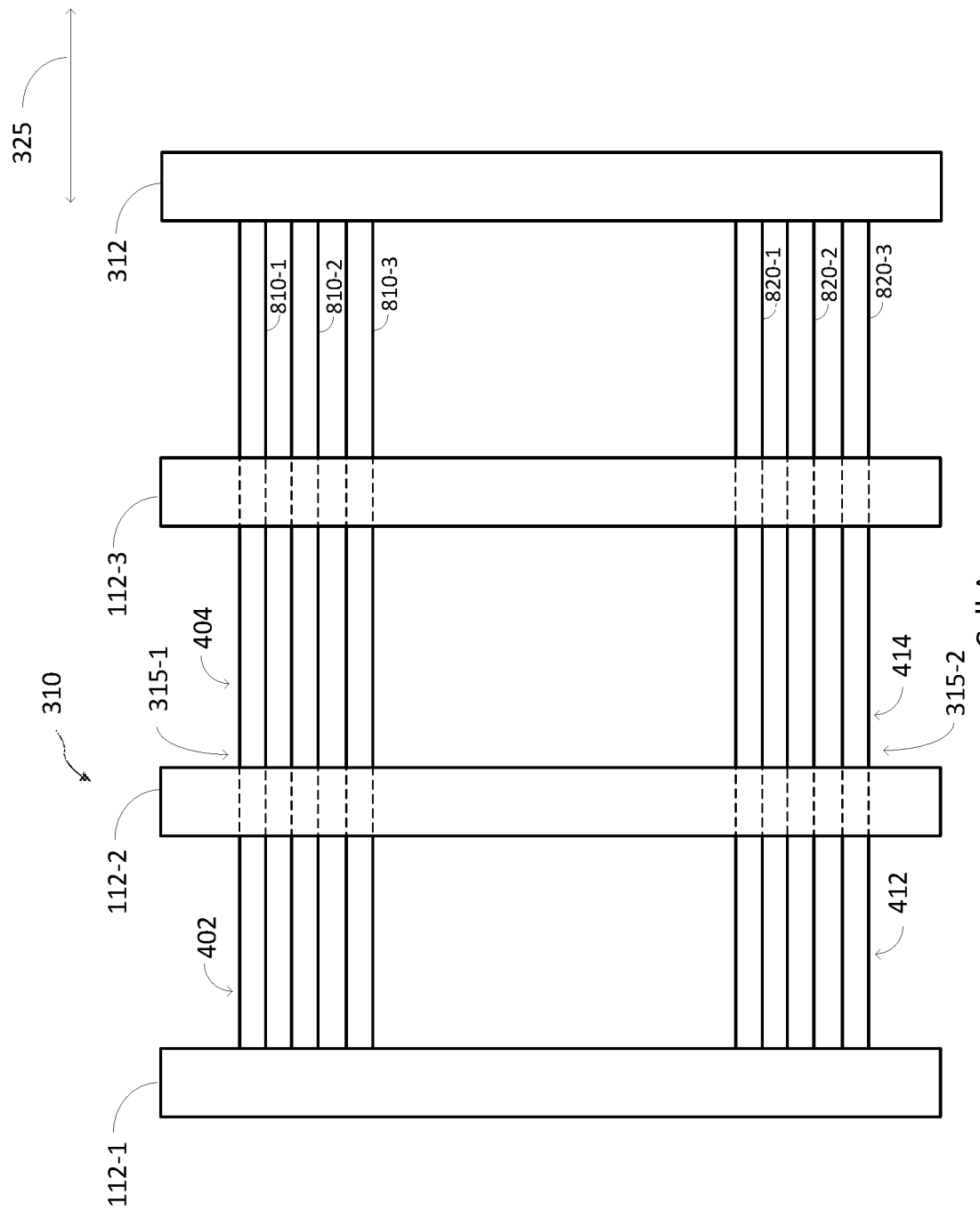
FIG. 8 shows an example of a larger version of the cell shown in FIG. 7 according to certain aspects of the present disclosure.

FIG. 8 shows an example in which the first active region 315-1 of cell A+ 310 includes multiple fins 810-1 to 810-3, and the second active region 315-2 of cell A+ 310 includes multiple fins 820-1 to 820-3. The fins 810-1 to 810-3 and 820-1 to 820-3 may be fabricated using a FinFET semiconductor process.

In this example, the fins 810-1 to 810-3 in the first active region 315-1 are similar to the fins 710-1 to 710-3 shown in FIG. 7 except that the fins 810-1 to 810-3 extend to the additional gate 312. Thus, the fins 810-1 to 810-3 are longer than the fins 710-1 to 710-3 by approximately on gate pitch in lateral direction 325.

The fins 820-1 to 820-3 in the second active region 315-2 are similar to the fins 720-1 to 720-3 shown in FIG. 7 except that the fins 820-1 to 820-3 extend to the additional gate 312. Thus, the fins 820-1 to 820-3 are longer than the fins 720-1 to 720-3 by approximately on gate pitch in lateral direction 325.

In certain aspects, an electronic design automation (EDA) system may be configured to determine whether there is a gap between two cells on a die, and, if the EDA determines that there is a gap between the two cells (e.g., equal to or greater than one gate pitch), to replace one of the cells with a larger version of the cell to fill in the gap.

Figure 9:
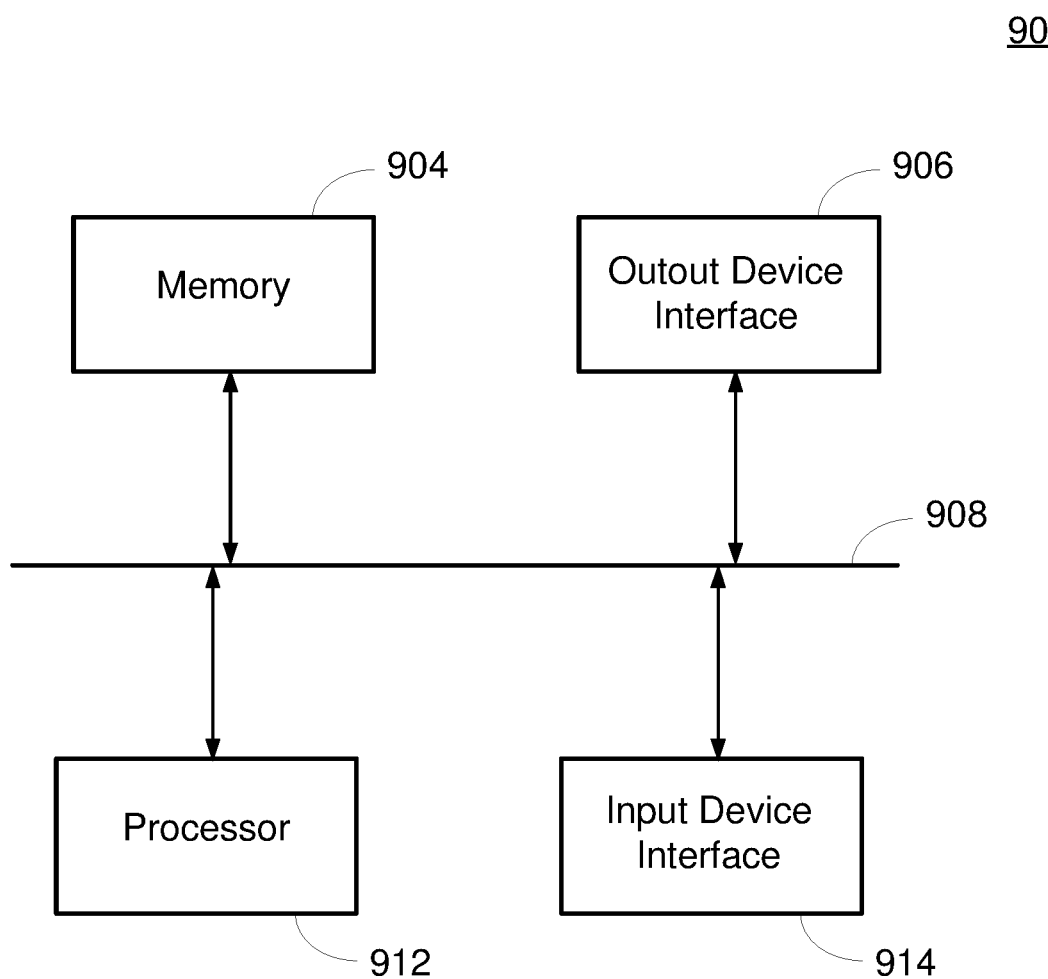
FIG. 9 shows an example of an electronic design automation (EDA) system according to certain aspects of the present disclosure.

In this regard, FIG. 9 shows an example of an EDA system 900 according to certain aspects of the present disclosure. The EDA system 900 includes a bus 908, a processor 912, a memory 904, an input device interface 914, and an output device interface 906. The bus 908 collectively represents all system buses that communicatively couple the numerous devices of the EDA system 900. For instance, the bus 908 communicatively couples the processor 912 with the memory 904.

In operation, the processor 912 may retrieve instructions from the memory 904 for performing one or more of the functions described herein, and execute the instructions to perform the one or more functions. The processor 912 may be a single processor or a multi-core processor. The memory 904 may include a random access memory (RAM), a read only memory (ROM), a flash memory, registers, a hard disk, a removable disk, a CD-ROM, or any combination thereof.

The bus 908 may also couple to the input and output device interfaces 914 and 906. The input device interface 914 may enable a user to communicate information and enter commands to the EDA system 900, and may include, for example, an alphanumeric keyboard and a pointing device (e.g., a mouse). For example, the user may use the input device interface 914 to enter a command to the processor 912 to control operations of the processor 912. The output device interface 906 may enable, for example, the display of information generated by the EDA system 900 to a user, and may include, for example, a display device (e.g., liquid crystal display (LCD)).

The memory 904 may include a cell library, in which the cell library defines various cells that can be placed on a die for a semiconductor process. For each cell, the cell library may define the layout of the transistors in the cell, and an interconnect structure interconnecting the transistors in the cell to form a circuit (e.g., a logic gate).

In certain aspects, the cell library may include a default cell and a larger version of the default cell for a particular logic gate (e.g., an inverter, a NAND gate, a NOR gate, etc.). For example, the cell library may include a default cell (e.g., cell A 110) and a larger version of the default cell (e.g., cell A+ 310) for an inverter.

During initial cell layout, the EDA may use the default cell for each instance of the logic gate in the integrated circuit. This may be done to minimize the area of the integrated circuit on the die. For example, for each inverter in the integrated circuit, the EDA system 900 may place an instance of cell A 110 on the die for the inverter.

The EDA system 900 lays out the cells on the die subject to layout and/or metal routing restrictions (constraints), which may be defined in a file stored in the memory 904. The layout and/or metal routing restrictions may result in gaps between some of the cells on the die. For example, the restrictions may result in a gap between an instance of the default cell (e.g., cell A 110) for the logic gate (e.g., inverter) and an adjacent cell (e.g., cell B 120) on the die.

After the initial cell layout, the EDA system 900 may examine each instance of the default cell on the die for the logic gate to determine whether there is a gap (e.g., equal to or greater than one gate pitch) between the default cell and an adjacent cell on the initial cell layout. If the EDA system 900 determines that there is a gap, then the EDA system 900 replaces the instance of the default cell with an instance of the larger version of the default cell to fill in the gap. For the example of the inverter, the EDA system 900 may examine each instance of cell A 110 on the die to determine whether there is a gap (e.g., equal to or greater than one gate pitch) between the instance of cell A 110 and an adjacent cell on the die. If the EDA system 900 determines that there is a gap, then the EDA system 900 replaces the instance of cell A 110 with an instance of cell A+ 310 to fill in the gap.

As a result, the cell layout generated by the EDA system 900 for the integrated circuit may include multiple instances of the default cell and multiple instances of the larger version of the default cell for the logic gate. For the example of the inverter, the cell layout generated by the EDA system 900 for the integrated circuit may include multiple instances of cell A 110 and multiple instances of cell A+ 310. The EDA system 900 may generate a file specifying the cell layout, and store the file in the memory 904.

Figure 10:
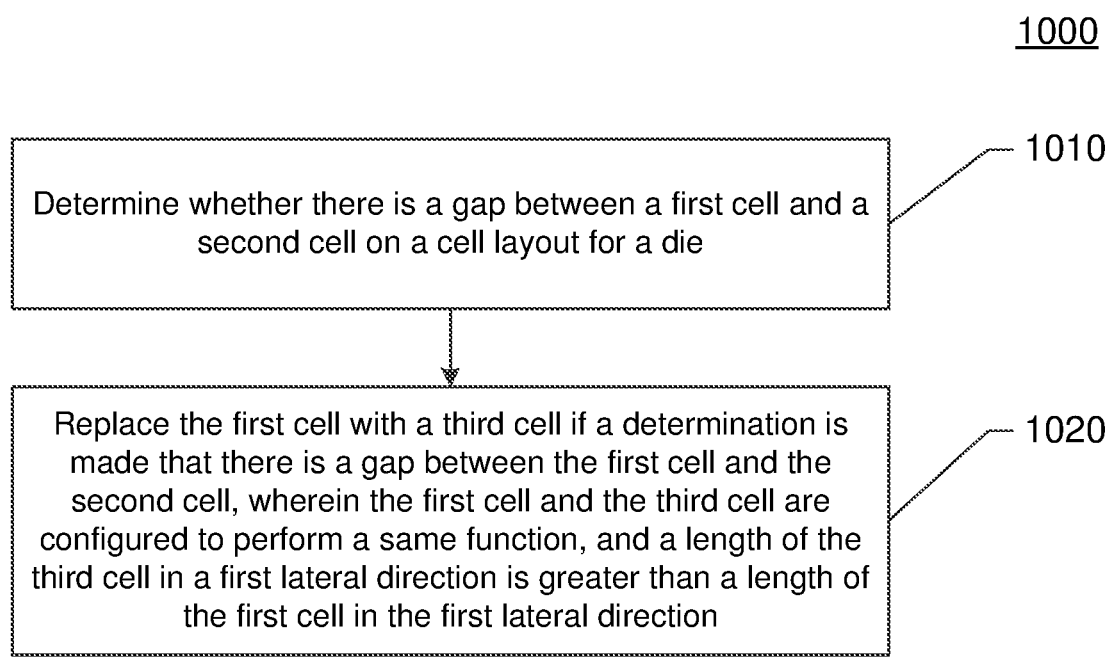
FIG. 10 is a flowchart illustrating a method for chip design according to certain aspects of the present disclosure.

FIG. 10 is flowchart illustrating a computer-implemented method 1000 for chip design according to certain aspects of the present disclosure. The method 1000 may be performed by the EDA system 900.

At step 1010, the EDA system 900 determines whether there is a gap between a first cell and a second cell on a cell layout for a die. For example, the EDA system 900 may determine whether there is a gap between the first cell and the second cell equal to or greater than one gate pitch.

At step 1020, the EDA system 900 replaces the first cell with a third cell if a determination is made that there is a gap between the first cell and the second cell, wherein the first cell and the third cell are configured to perform the same function, and a length of the third cell in a first lateral direction is greater than a length of the first cell in the first lateral direction. For example, the third cell (e.g., cell A+ 310) may be longer than the first cell (e.g., cell A) by at least one gate pitch to fill in a gap of at least one gate pitch.

It is to be appreciated that the exemplary structures discussed above are subject to a small degree of process variation on a physical chip, which is unavoidable in semiconductor fabrication processes. Therefore, the exemplary structures described above are intended to cover structures on a physical chip that vary slightly from the exemplary structures due to the process variation of the fabrication process used to fabricate the chip.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "electrically coupled" is used herein to refer to the direct or indirect electrical coupling between two structures.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A semiconductor die, comprising:
a first cell comprising:
first transistors; and
a first interconnect structure interconnecting the first transistors to form a first circuit, the first interconnect structure including a first input metal line and a first output metal line; and
a second cell comprising:
second transistors; and
a second interconnect structure interconnecting the second transistors to form a second circuit, the second interconnect structure including a second input metal line and a second output metal line;
wherein the first circuit and the second circuit are configured to perform a same function, and a length of the first cell in a first lateral direction is greater than a length of the second cell in the first lateral direction, and
wherein a spacing between the first input metal line and the first output metal line is approximately the same as a spacing between the second input metal line and the second output metal line.

2. The semiconductor die of claim 1, wherein a length of the first cell in a second lateral direction is approximately the same as a length of the second cell in the second lateral direction, and the second lateral direction is approximately perpendicular to the first lateral direction.

3. The semiconductor die of claim 1, wherein:
the first cell comprises first gates, wherein the first transistors include at least a portion of one or more of the first gates; and
the second cell comprises second gates, wherein the second transistors include at least a portion of one or more of the second gates, and a number of the first gates is greater than a number of the second gates.

4. The semiconductor die of claim 3, wherein the first gates are approximately spaced apart from one another by a gate pitch, the second gates are approximately spaced apart from one another by the gate pitch, and the length of the first cell in the first lateral direction is greater than the length of the second cell in the first lateral direction by at least the gate pitch.

5. The semiconductor die of claim 4, wherein the first gates run parallel with one another along a second lateral direction, the second gates run parallel with one another along the second lateral direction, and the second lateral direction is approximately perpendicular to the first lateral direction.

6. The semiconductor die of claim 5, wherein a length of the first cell in the second lateral direction is approximately the same as a length of the second cell in the second lateral direction.

7. The semiconductor die of claim 3, wherein:
the first cell comprises a first active region, wherein the first transistors include at least a portion of the first active region; and
the second cell comprises a second active region, wherein the second transistors include at least a portion of the second active region, and a length of the first active region in the first lateral direction is greater than a length of the second active region in the first lateral direction.

8. The semiconductor die of claim 7, wherein the first active region extends under the one or more of the first gates, and the second active region extends under the one or more of the second gates.

9. The semiconductor die of claim 7, wherein the first gates are approximately spaced apart from one another by a gate pitch, the second gates are approximately spaced apart from one another by the gate pitch, and the length of the first active region in the first lateral direction is greater than the length of the second active region in the first lateral direction by at least the gate pitch.

10. The semiconductor die of claim 7, wherein:
the first active region comprises first fins, wherein the first fins extend in the first lateral direction; and
the second active region comprises second fins, wherein the second fins extend in the first lateral direction.

11. A semiconductor die, comprising:
a first cell comprising:
first transistors; and
a first interconnect structure interconnecting the first transistors to form a first circuit; and
a second cell comprising:
second transistors; and
a second interconnect structure interconnecting the second transistors to form a second circuit;
wherein the first circuit and the second circuit are configured to perform a same function, and a length of the first cell in a first lateral direction is greater than a length of the second cell in the first lateral direction, and
wherein each of the first and second circuits comprises a respective inverter.

12. The semiconductor die of claim 11, wherein:
the first transistors comprise a first p-type field effect transistor (PFET) and a first n-type field effect transistor (NFET); and
the second transistors comprise a second PFET and a second NFET.

13. The semiconductor die of claim 12, wherein:
the first interconnect structure couples a gate of the first PFET and a gate of the first NFET together, and couples a drain of the first PFET and a drain of the first NFET together; and
the second interconnect structure couples a gate of the second PFET and a gate of the second NFET together, and couples a drain of the second PFET and a drain of the second NFET together.

* * * * *